United States Patent [19]

Revay et al.

[11] Patent Number: 5,195,082
[45] Date of Patent: Mar. 16, 1993

[54] OPTICAL DISK STRUCTURES FOR ELECTRON TRAPPING OPTICAL MEMORY MEDIA

[75] Inventors: Robert E. Revay, Washington, D.C.; Daniel T. Brower, Bowie, MD.; Greg D. Espin, Hopewell Junction, N.Y.

[73] Assignee: Optex Corporation, Rockville, Md.

[21] Appl. No.: 871,812

[22] Filed: Apr. 22, 1992

Related U.S. Application Data

[63] Continuation-in-part of Ser. No. 449,005, Dec. 12, 1989, Pat. No. 5,128,849.

[51] Int. Cl.$^5$ .............. G11B 3/70; G11C 13/04; G03C 1/00
[52] U.S. Cl. .................. 369/275.2; 365/110; 369/284; 430/495; 430/945
[58] Field of Search ............ 365/106, 110, 111, 112; 369/275.2, 288, 284, 286; 428/690; 430/495, 945

[56] References Cited

U.S. PATENT DOCUMENTS

| | | |
|---|---|---|
| 2,521,124 | 9/1950 | Miller . |
| 2,522,074 | 9/1950 | Urbach . |
| 2,527,365 | 10/1950 | Leverenz . |
| 2,742,631 | 4/1956 | Rajchman et al. . |
| 2,979,467 | 4/1961 | Keller . |
| 3,767,588 | 10/1973 | Otomo et al. . |
| 4,064,066 | 12/1977 | Toshinai et al. . |
| 4,113,353 | 9/1978 | Matsushita . |
| 4,170,475 | 10/1979 | Kuehnle et al. . |
| 4,358,519 | 11/1982 | Chang et al. ................ 365/112 |
| 4,527,173 | 7/1985 | Gupta et al. . |
| 4,549,083 | 10/1985 | Ozawa . |
| 4,576,884 | 3/1986 | Reisman . |
| 4,704,635 | 11/1987 | Nudelman . |
| 4,778,985 | 10/1988 | Modisette et al. . |
| 4,819,210 | 4/1989 | Miura et al. ................ 365/106 |
| 4,864,536 | 9/1989 | Lindmayer . |
| 5,013,635 | 5/1991 | Ohkawa et al. . |
| 5,038,321 | 8/1991 | Van Zeghbroeck . |
| 5,063,538 | 11/1991 | Kuehnle . |
| 5,113,387 | 5/1992 | Goldsmith ................ 369/275.2 |
| 5,128,849 | 7/1992 | Podraczky et al. ................ 365/106 |

FOREIGN PATENT DOCUMENTS

AU85/00089 11/1985 Australia .

OTHER PUBLICATIONS

S. P. Keller et al., "Studies on Some Infrared Stimulable Phosphors", *Physical Review,* vol. 108, No. 3, Nov. 1, 1957.
Lindmayer, "Infrared Phosphors as Sensors", *Sensors,* Mar., 1986.
Mims, II, "How to See Near-Infrared Radiation", *Modern Electronics,* May, 1986.
Foreman, Jr., et al., "Optical Memory Characteristics of a SrS(Eu, Sm) Phosphor", Proceedings of the IEEE, pp. 425-426, Mar., 1966.
Duggan, Jr., et al., "Optical Dynamic Disk Storage Device", *IBM Technical Disclosure Bulletin,* vol. 21, Oct. 5, 1980.
"Phosphor Disk Bit Storage", *Transactions of the IECE of Japan,* vol. E59, No. 10, Oct. 1976.
Lindmayer, "A New Erasable Optical Memory", *Solid State Technology,* Aug. 1988.

*Primary Examiner*—Eugene R. LaRoche
*Assistant Examiner*—Christopher R. Glembocki
*Attorney, Agent, or Firm*—Dickstein Shapiro & Morin

[57] ABSTRACT

An optical disk structure for an erasable optical disk for use with an erasable optical disk drive using electron trapping optical memory media is disclosed in which several distinct layers in addition to the electron trapping optical memory media are utilized in order to minimize light scatter between adjacent tracks on the disk and to carry permanent format and guidance information for use in acccomplishing the write, read and focusing and traking functions of the erasable optical disk drive with which the disk structures are utilized. The use of absorbing layers as part of the optical disk structure for attenuating reflections of light within the disk structure and eliminating the spreading of marks is also disclosed.

12 Claims, 14 Drawing Sheets

PROTECTIVE LAYER (22)

REFLECTING LAYER (20)

SECOND THICK POLYMER LAYER (122)

FIRST THICK POLYMER LAYER (120)

E.T.O.M. LAYER (14)

TRANSPARENT SUBSTRATE (10a)

100K — AIR

LIGHT IMPINGING SIDE

AIR — LIGHT IMPINGING SIDE

DUST DEFOCUSING LAYER (22)

REFLECTIVE LAYER (20)
ABSORBING LAYER (16)

E.T.O.M. LAYER (14)

REFLECTING LAYER (12)

SUBSTRATE (10)

REFLECTING LAYER (12)

E.T.O.M. LAYER (14)

ABSORBING LAYER (16)
REFLECTIVE LAYER (20)

DUST DEFOCUSING LAYER (22)

AIR — LIGHT IMPINGING SIDE

FIG. 1A

OPTICAL DISK STRUCTURES FOR ELECTRON TRAPPING OPTICAL MEMORY MEDIA

CROSS-REFERENCE TO RELATED APPLICATIONS

This application is a continuation-in-part of U.S. patent application Ser. No. 07/449,005, filed Dec. 12, 1989 and entitled "Optical Disk Structures for Electron Trapping Optical Memory", which issued as U.S. Pat. No. 5,128,849 on Jul. 7, 1992. The assignee is a related company to the assignee of U.S. Pat. No. 4,864,536, issued Sep. 5, 1989 and entitled "Optical Memory Method and System", U.S. patent application Ser. No. 07/184,263, filed Apr. 21, 1988 and entitled "Thin Film Photoluminescent Articles and Method of Making Same", which issued as U.S. Pat. No. 4,915,982 on Apr. 10, 1990, U.S. patent application Ser. No. 07/225,846, filed Jul. 29, 1988 and entitled "Optical Disk Drive System", which issued as U.S. Pat. No. 5,007,037 on Apr. 9, 1991, U.S. patent application Ser. No. 07/277,255, filed Nov. 29, 1988 and entitled "Three Dimensional Optical Memory". Reference is also made to commonly assigned U.S. patent application Ser. No. 07/449,002, filed Dec. 12, 1989 and entitled "Three Laser Optical Disk Drive System, which issued as U.S. Pat. No. 5,113,387 on May 12, 1992. The disclosure of each of those patents and applications is incorporated by reference herein.

The present invention relates to disks for use with optical mass storage devices for data storage. More particularly, the present invention relates to a method of and apparatus for constructing an erasable optical disk for mass data or information storage which performs all of the storage functions, that is, the writing, reading and erasing of data, in a purely photoelectric manner.

Optical storage devices for use in storing computer and other data are presently known in the art. Such devices are desirable because of their ability to store vastly more information per disk than known magnetic disk storage devices. While most of the known optical disk drive devices perform read-only functions, write-once-read-many times (WORM) and erasable optical memory systems are also known. However, heretofore, erasable optical memory systems have encountered much greater developmental difficulty than the read-only or WORM systems, due in part to the increased technical complexity of the characteristics of the disk media itself.

In order to overcome the problems of prior art erasable optical disk drives, a related company to the assignee of the present invention has developed a new approach to the optical storage materials which provide the storage function of the erasable optical disk drive. This development utilizes the phenomenon known as electron trapping in a class of materials which comprise an alkaline earth chalcogenide crystal typically doped with rare earth elements. Thin crystalline forms of such materials may be formed on various substrate structures, such as glass or alumina, in order to provide the disk storage medium. Since the electron trapping phenomenon is a purely electronic process, read-write-erase operations can be performed in very short periods of time. In addition, the physical trapping phenomenon appears to offer a practically limitless media life.

The materials which may be used as the media for the optical disk storage system described herein are the subject of U.S. patent application Ser. No. 07/184,263, which issued on Apr. 10, 1990 as U.S. Pat. No. 4,915,982 and which is a continuation of U.S. patent application Ser. No. 06/870,877, now U.S. Pat. No. 4,864,536 and U.S. Pat. No. 4,830,875, which issued on May 16, 1989. Other materials useful as the storage media herein are disclosed in U.S. Pat. No. 4,839,092, which issued Jun. 13, 1989, U.S. Pat. No. 4,806,772, which issued Feb. 21, 1989 and U.S. Pat. No. 4,842,960, which issued Jun. 27, 1989. The disclosure of that application and of each of those patents is incorporated by reference herein.

Reference is made to each of the foregoing issued U.S. patents and patent applications, as well as to the applications discussed in the Cross Reference To Related Applications section for a discussion of the electron trapping and electron trapping media phenomena.

In constructing such disks suitable for use with electron trapping optical material coated on disks, it is desirable to utilize a disk structure which allows a submicron resolution of written data patterns. In prior disk structures, as disclosed in the U.S. patent application Ser. No. 07/277,255 application and U.S. Pat. No. 4,864,536, for example, the methodology of writing, reading and erasing of the media consisted of performing all of those functions directly on a single layer of media. The data patterns are written in a specific location on the disk, using a focused short wavelength (for example, blue or green) light, which results in electrons becoming trapped and stored at those locations. The stored data patterns are then read by subsequent illumination with infrared light, which causes the trapped electrons to be released and to emit an orange light at the previously written storage locations. The orange emission is then converted to electrical signals which represent the original data patterns.

In addition to writing, reading and erasing functions, the necessary focusing and tracking functions are also performed using the same single layer electron trapping optical memory media. In order to accomplish the focusing and tracking functions, a portion of the infrared light produced by the read laser is reflected back from the media surface and transmitted to focusing and tracking error detection diodes. The derived focus error signal is proportional to the plane of the predetermined best focus of the reading laser spot and the active layer on the disk surface. The focus servo system utilizes that signal in order to position the objective lens so that the focal point is located at its optimum position.

The tracking operation is similar to that described with regard to the focusing operation, except that the output of the tracking error diodes is used to maintain both the radial position of the optical head on a given track and to permit the seeking and capture of a particular desired track.

Those prior disk structures for accomplishing reading, writing, erasing, focusing and track functions created certain disadvantages. For example, the assignee's prior methods of reading and writing would suffer light scattering, depending upon the materials utilized, due to internal reflections within the disk structure. The light scattering would cause regions of the material not illuminated by the write or read light sources to also participate in the electron trapping process. That effectively increases the size of the data mark. The enlargement of data marks due to internal scattering is referred to as "mark spreading."

Other disadvantages relate to the focusing and tracking functions. For example, the method for focusing and tracking has the potential for depleting the written data during the performance of the focus and tracking functions if the read beam illuminates and discharges data cells or bits. In addition, the prior method, while providing for the storage of permanent format and guidance data, did not make any provision to prevent accidental erasure of the stored data.

The invention disclosed herein overcomes the disadvantages of the prior disk structures and methods of performing the various functions associated with those structures by providing for several distinct layers each of which performs an active function, in addition to the active media layer. Incident light scattered to adjacent tracks is minimized by means of a reflective layer. The reflective layer is also utilized to carry the permanent format and guidance information as well as providing a surface for performing the focus and tracking functions. In addition, absorbing layers are included in order to attenuate reflections of light within the disk structure and to eliminate the spreading of marks.

The invention disclosed herein also overcomes the disadvantages of the prior structures and methods in which a reflective layer is used to approximately double the level of the signal read out from the disk. The reflective layer is utilized with a series of simple dyed layers which are placed between the ETOM phosphor layer and the reflective layer in order to suppress undesirable reflection at certain wavelengths.

SUMMARY AND OBJECTS OF THE INVENTION

In view of the foregoing, it should be apparent that there still exists a need in the art for a method of constructing and structures for an erasable optical disk for mass data or information storage purposes in which a plurality of layers are utilized in a simple and precise manner to achieve a sub-micron resolution of the written data patterns on the disk. It is, therefore, a primary object of this invention to provide a method of constructing and structures for an erasable optical disk which achieves a sub-micron resolution of the written data patterns while also providing for permanent format and guidance information.

More particularly, it is an object of this invention to provide a method of constructing and structures for an erasable optical disk in which light scattered to an adjacent track of the disk is minimized by means of absorbing and reflective layers.

Still more particularly, it is an object of this invention to provide a method of constructing and structures for an erasable optical disk in which absorbing layers are provided in order to attenuate reflections of light within the disk structure and to eliminate the spreading of marks.

Another object of the present invention is to provide a method of constructing and structures for an erasable optical disk in which a layer of material on the disk provides the surface for the focusing and tracking functions of the disk drive of which the disk forms a part.

It is yet another object of the present invention to provide a method of constructing and structures for an erasable optical disk in which the intensity of the read out signal from the disk is increased by use of a reflective layer and in which additional wavelength reflective layers of material are placed on the disk between the ETOM phosphor layer and the reflective layer in order to suppress certain undesired wavelengths.

Briefly described, these and other objects of the invention are accomplished in accordance with its method of constructing and structure aspects by providing a layer of electron trapping optical memory material on a substrate and by providing several other layers of reflective and/or absorbing material on top of the electron trapping layer. In that manner, light scattered to adjacent tracks is minimized and a resolution of the written data pattern at the sub-micron level is obtained. The inventive disk structure also includes the use of a reflective layer for carrying permanent format and guidance information for the operation of the disk drive, as well as providing the surface for the focus and tracking functions. The absorbing layers are utilized to attenuate reflections of light within the disk structure and to eliminate the spreading of marks.

The instant invention also discloses the use of first and second thick polymer layers of material which are placed on the disk between the layer of electron trapping optical memory material and a reflective layer so that, the reflective layer can be used to double the level of the read out signal. Such thick polymer layers are designed to respectively absorb the writing and stimulating or erasing wavelengths, which would otherwise cause undesirable standing waves after being reflected by the reflective layer.

With these and other objects, advantages and features of the invention that may become hereinafter apparent, the nature of the invention may be more clearly understood by reference to the following detailed description of the invention, the appended claims and to the several drawings attached herein.

BRIEF DESCRIPTION OF THE DRAWINGS

All of the diagrams in FIGS. 1-11 show different disk structures. These structures have patterned reflective and absorbing layers to provide focus, tracking, read, write and erase functions as shown in FIG. 12.

DETAILED DESCRIPTION OF THE PREFERRED EMBODIMENT

Figure 1:
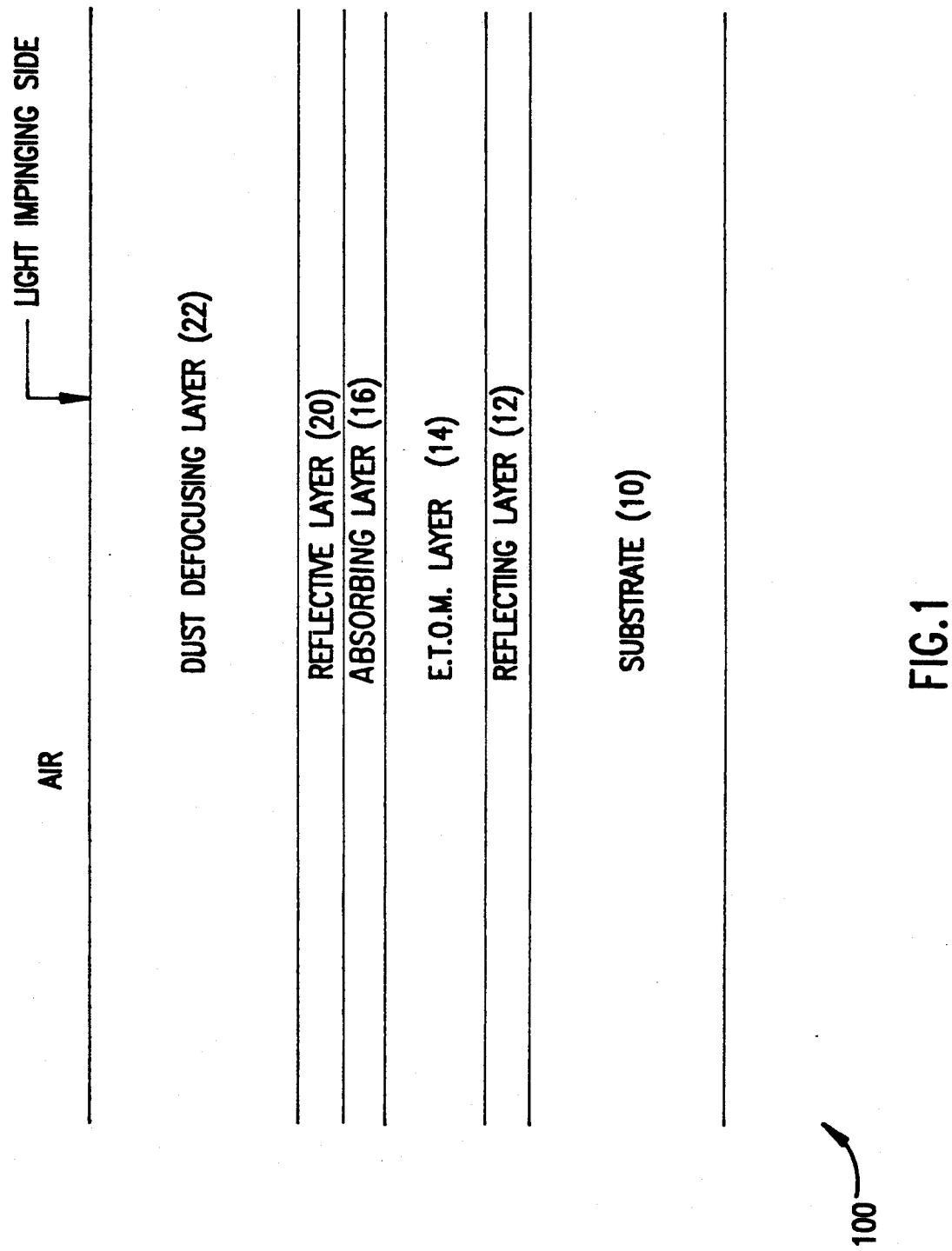
FIGS. 1-6 are diagrams showing various different disk structures utilizing an electron trapping layer and different combinations of reflective and/or absorbing layers and a transparent overcoat.

Referring now in detail to the drawings wherein like parts are designated by like reference numerals throughout, there is illustrated in FIG. 1 a drawing of a first and preferred disk structure for use with an erasable optical disk drive system. The various layers of material are deposited on a substrate structure 10, which may be preferably a ceramic material, such as aluminum oxide. Alternatively, high temperature glasses and other ceramic materials, such as SPINEL (magnesium aluminum silicate) can be used. The substrate may preferably be 1-2 mm in thickness. It should be understood that the layers on the drawings are not drawn to scale with respect to the relative dimensions of the layers or size of the disk.

On top of the substrate, a reflecting layer 12 is placed, either by vapor or electron beam deposition, sputtering or any other of many similar known processes. This reflecting layer 12 serves to reflect the visible photon emission created by impingement of a read laser beam on the disk 100 and therefore provides for a greater intensity read back signal. It may be formed from a metal, such as aluminum, and have a thickness of a few hundred Angstroms.

The electron trapping layer 14 is deposited on top of the first reflecting layer 12 and, as previously discussed, provides the data storage capacity through the electron trapping phenomena. It may preferably be between 1-5 microns in thickness. Deposited on the electron trapping layer is an absorbing layer 16, which functions to absorb reflected and scattered light from both the infrared read and visible write beams. The absorption layer may preferably be 500-5000 Angstroms in thickness.

A light reflective layer 20 is deposited on top of the absorbing layer 16 and provides a specular surface in order to facilitate low power focus and tracking. This layer 20 may be formed of the same material as the reflecting layer 12. This reflective layer 20 may be an interrupted discontinuous layer which allows "open areas" for access of the write and read light to the ETOM material beneath the layer. The discontinuous pattern can be formed through the use of ordinary photolithographic masks which are well known in the art.

A transparent overcoat 22 is coated on top of the reflective layer 20 and serves to protect the optical layers on the substrate from dust and moisture while at the same time providing a transparent layer through which reading from and writing to the disk can be accomplished. The overcoat layer 22 may be formed of transparent polymer and be about 0.01 to 1 millimeter in thickness. It also provides a dust defocusing function.

Although the disk structure shown in FIG. 1 shows light impinging onto the disk 100 from the top of the disk, the layers 12, 14, 16, 20 and 22 may likewise be deposited on the other side of the substrate 10 in order to form double-sided disk. Such a disk structure is shown in FIG. 1A. It should be noted, however, that each side of the disk 100 can only be written to and read from using a light beam on that respective side of the disk 100.

Figure 2:
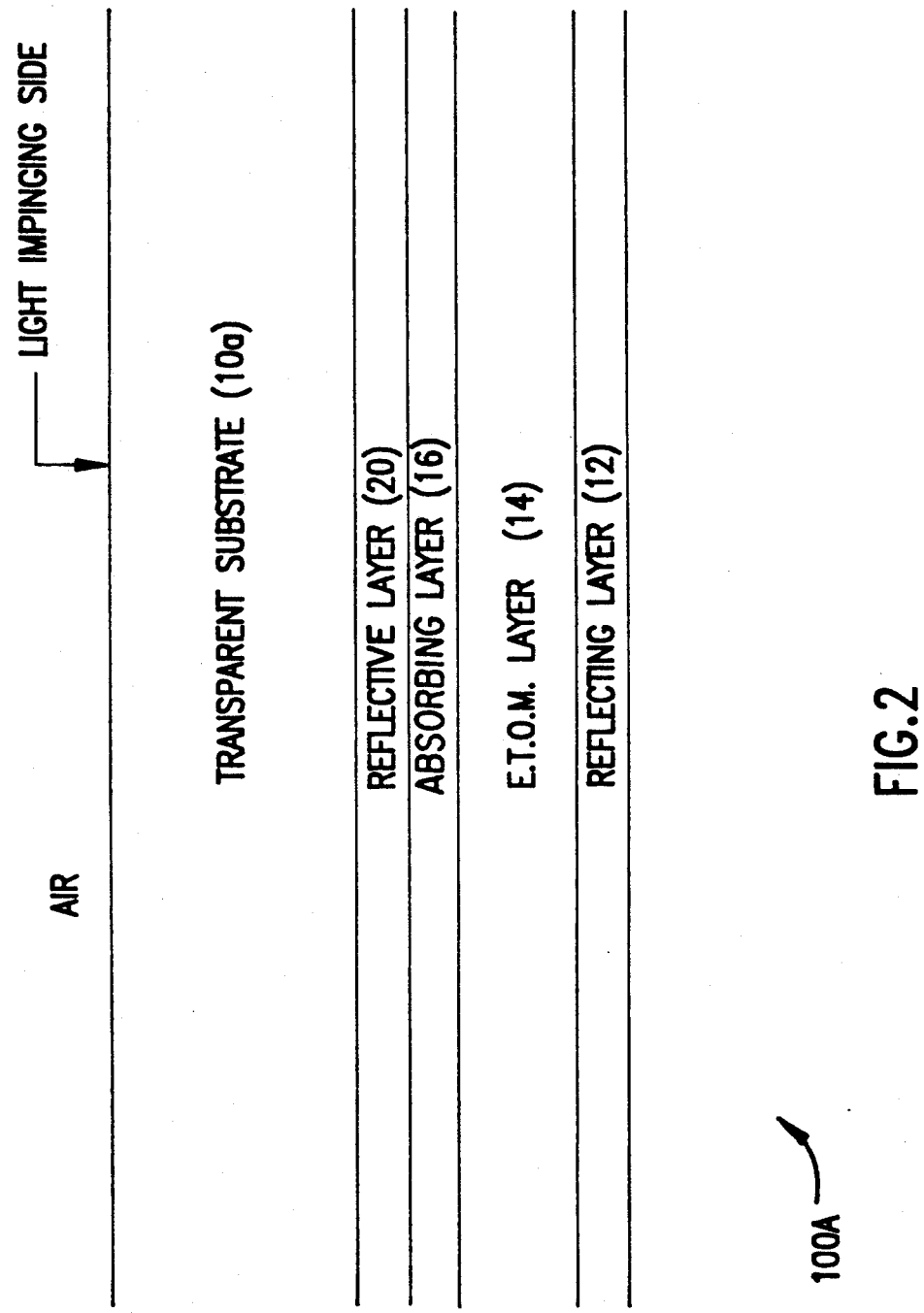

FIG. 2 shows an alternate embodiment of a disk structure 100A of the present invention in which a transparent substrate 10a is utilized. Such transparent substrate may be made from a glass or other suitable rigid yet transparent material which can withstand the heat to which the disk is subjected during the manufacturing process.

On the side of the substrate 10a opposite from the location of the impinging light, a reflective layer 20 is deposited, which provides a specular surface for enabling low light level focusing and tracking functions of the disk drive system. An absorbing layer 16 absorbs scattered and reflected light from the infrared read and visible write beams. The electron trapping layer 14 is deposited on top of the absorbing layer 16, in order to provide the storage capability for the disk. The reflecting layer 12 reflects the visible emission generated by impingement of the read beam, thus providing a greater intensity read back signal. It should be noted, however, that while the disk structure 100A can be used only in a front surface, through the lens read back configuration, two such structures can be sandwiched together in order to form a double-sided disk. A protective layer (not shown) may be deposited on top of the reflecting layer 12. It serves to protect the disk and layers 20, 16 and 12 from dust and moisture.

Figure 3:
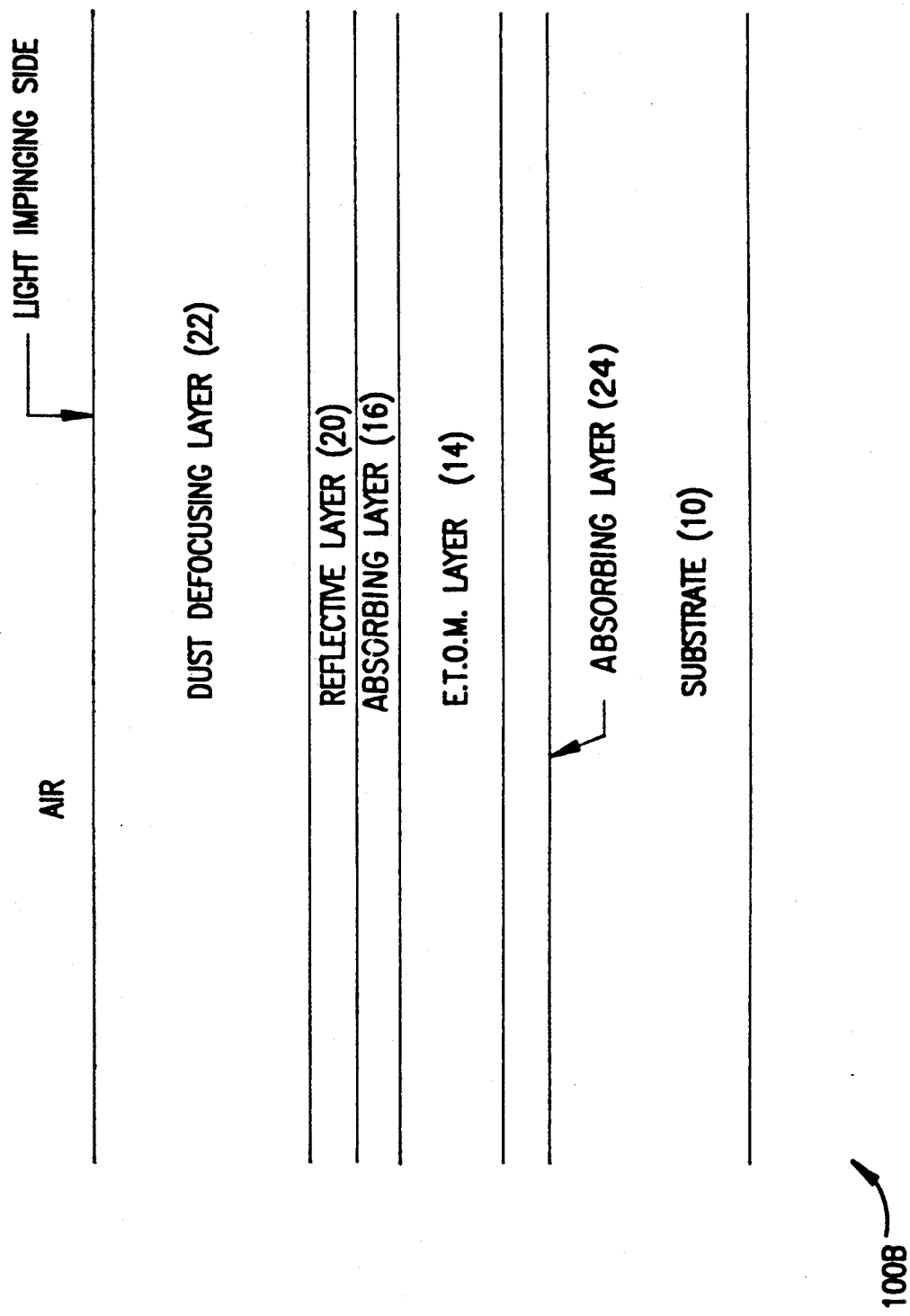

FIG. 3 is a diagram showing yet another alternate embodiment of a disk structure 100B which may be utilized as the erasable optical disk of the present invention. The disk structure shown in FIG. 3 utilizes a ceramic or other material substrate 10 upon which is coated two absorbing layers 24 and 16, separated by a coating of an electron trapping layer 14. A reflective layer 20 is coated on top of the absorbing layer 16. Within such a configuration, the reflective layer 20 serves to provide a specular surface for the focus and tracking functions. The first absorbing layer reduces scattering in the disk by absorbing the visible write and infrared read wavelengths from the read and write beams. The electron trapping layer provides the storage capability for the disk.

The additional absorbing layer 24, which is utilized in place of the reflecting layer 12 shown in FIG. 1, serves to further reduce the scatter within the disk from the infrared read and visible write beams. The transparent overcoat 22 provides protection for the disk structure 100B from dust and moisture and also acts as a dust defocuser.

The disk structure 100B shown in FIG. 3 can be read through the overcoat 22 from the front or top side of the disk only, as shown in FIG. 3. However, the structure of the layers 14, 16, 20, 22 and 24 may be deposited on both sides of the substrate 10 in order to form a double-sided disk.

Figure 4:
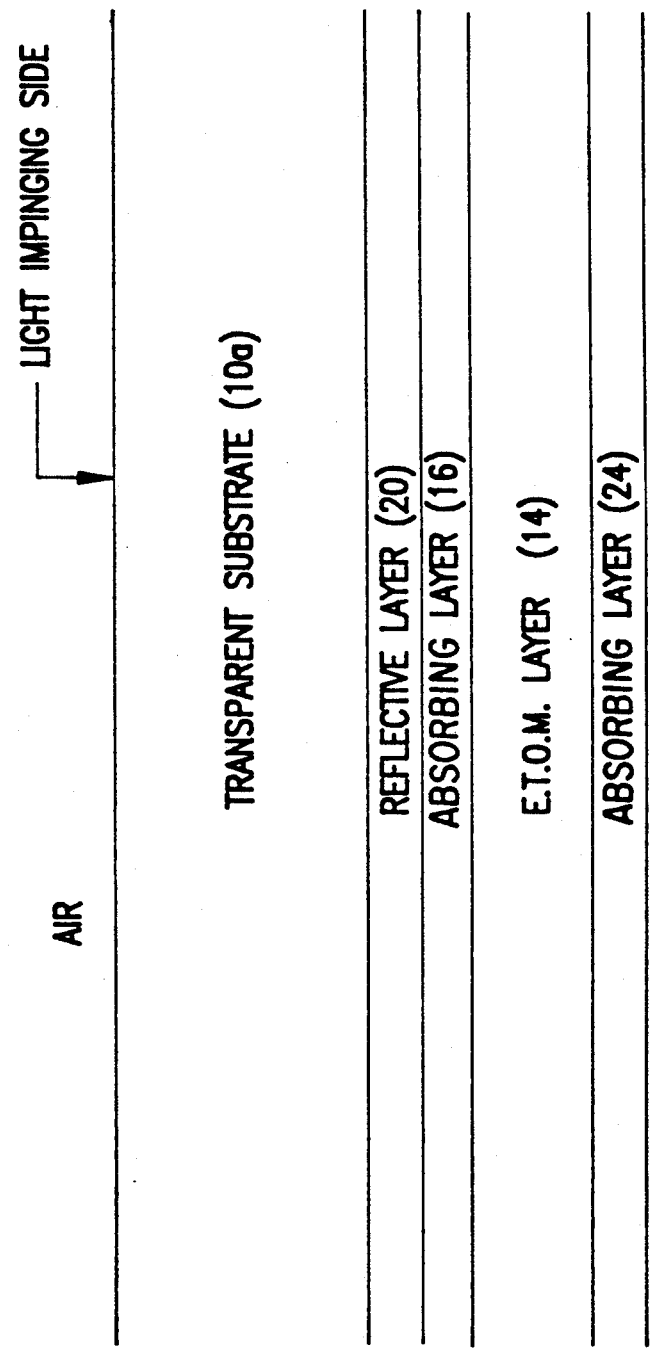

FIG. 4 shows another alternate embodiment of the disk structure of the present invention. As shown in FIG. 4, the disk structure 100C is the same as the disk structure 100A shown in FIG. 2, except that the reflecting layer 12 has been replaced by an absorbing layer 24. Thus, the various layers shown in the disk structure of FIG. 4 are the same as those shown in the disk structure of FIG. 3, and operate in the same manner. However, the layers 20, 14, 16 and 24 are deposited upon a transparent substrate 10a in the disk structure 100C of FIG. 4, whereas the substrate 10 of FIG. 3 need not be transparent. A protective overcoat layer (not shown) may optionally be utilized with the disk structure 100C shown in FIG. 4.

The disk structure 100C shown in FIG. 4 can be read from the front side of the disk only. Two such structures may be sandwiched together in order to form a double-sided disk.

Figure 5:
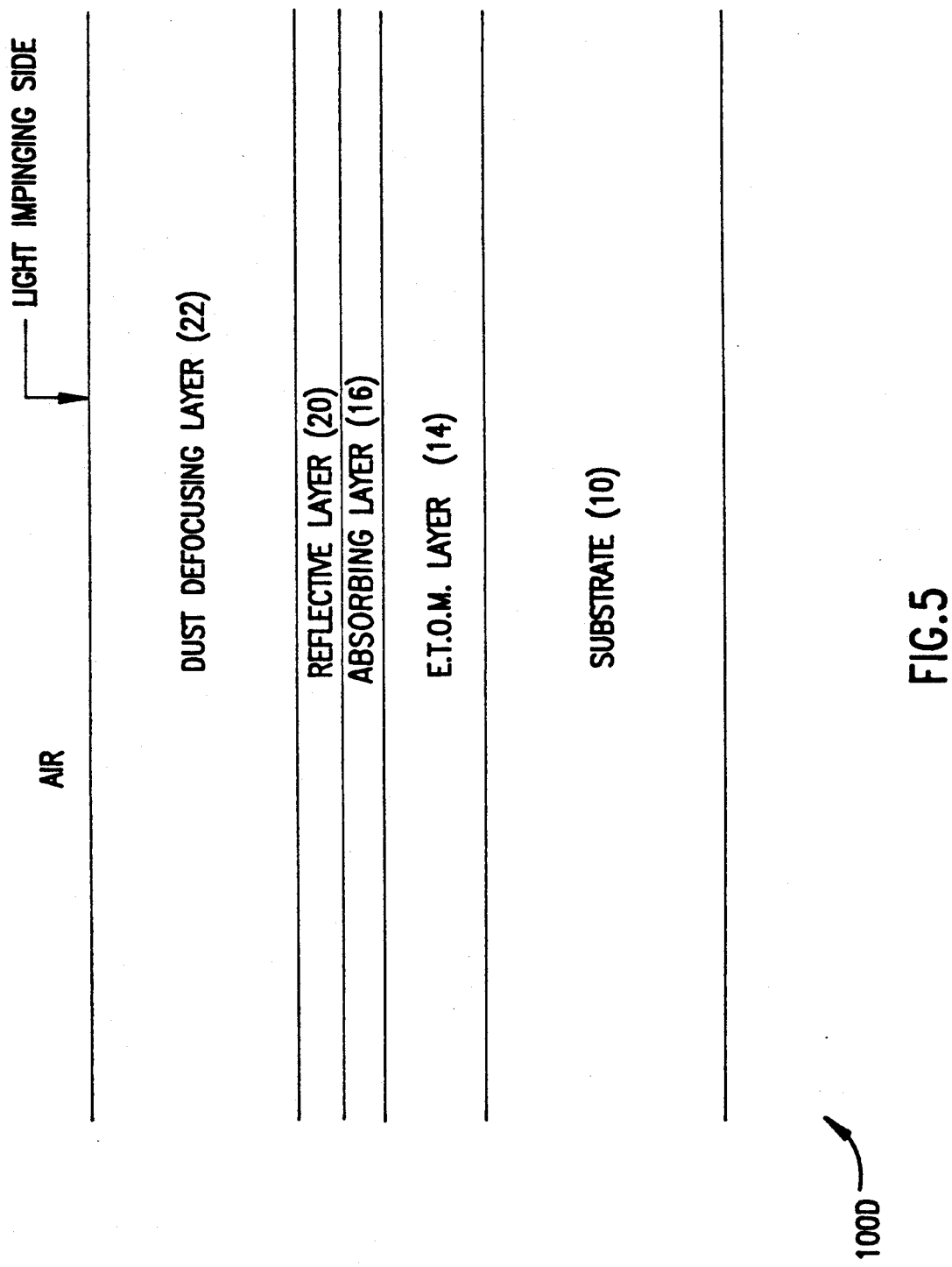

FIG. 5 is a diagram of another alternate disk structure for use in forming the erasable optical disk of the present invention. The disk structure 100D shown in FIG. 5 includes a substrate 10, which may or may not be transparent, upon which is deposited an electron trapping layer 14. An absorbing layer 16 is deposited on top of the electron trapping layer 14 in order to reduce scatter from the infrared read and visible write laser beams. A reflective layer 20 is deposited on top of the absorbing layer 16 in order to provide a specular surface for the purposes previously described. A dust defocusing layer 22 may be deposited on top of the reflective layer 20 in order to protect the disk structure 100D from dust and moisture and to serve a dust defocusing function.

The disk structure 100D shown in FIG. 5 is suitable for reading from either the front or the back of the substrate 10. However, if it is desired to read from the back or bottom side of the substrate, the substrate, of course, must be made from a transparent material.

Figure 6:
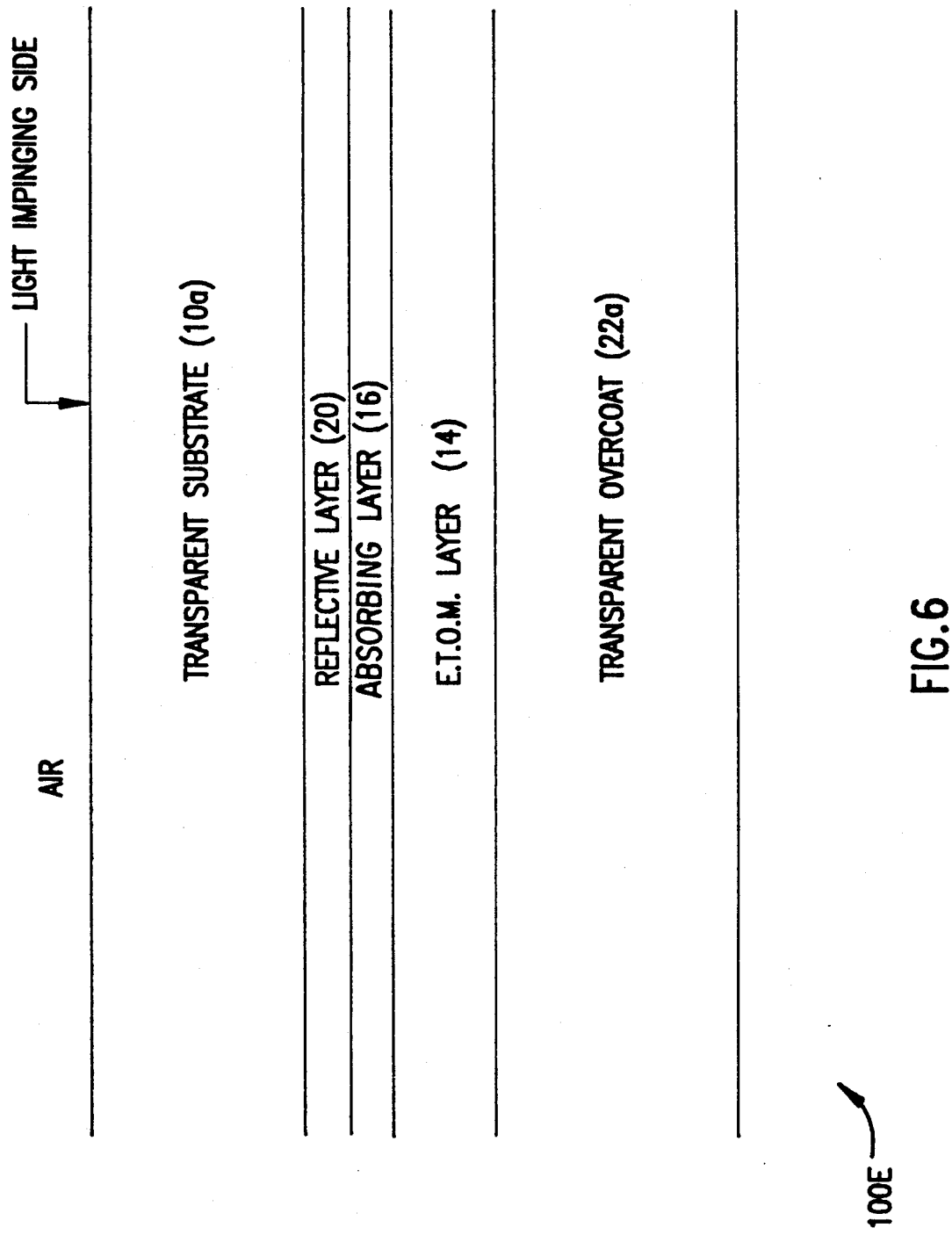

FIG. 6 shows a diagram of yet another alternate embodiment of the erasable optical disk of the present invention. A specular reflective layer 20 is deposited on the underside of a transparent substrate 10a in order to allow for low power focus and tracking without discharging the active electron trapping layer 14. On top of the reflective layer 20, an absorbing layer 16 is deposited, whose function is to absorb and thereby reduce the scatter from the infrared read and visible write beams created by their impingement on the disk structure 100E.

The active electron trapping layer 14 is deposited on top of the absorbing layer 16. On top of the electron trapping layer 14, a transparent overcoat 22a is deposited, in order to provide protection from dust and moisture. The disk structure of FIG. 6 is suitable for reading from either the front (through the lens) or backside of the disk 100E.

Figure 7:
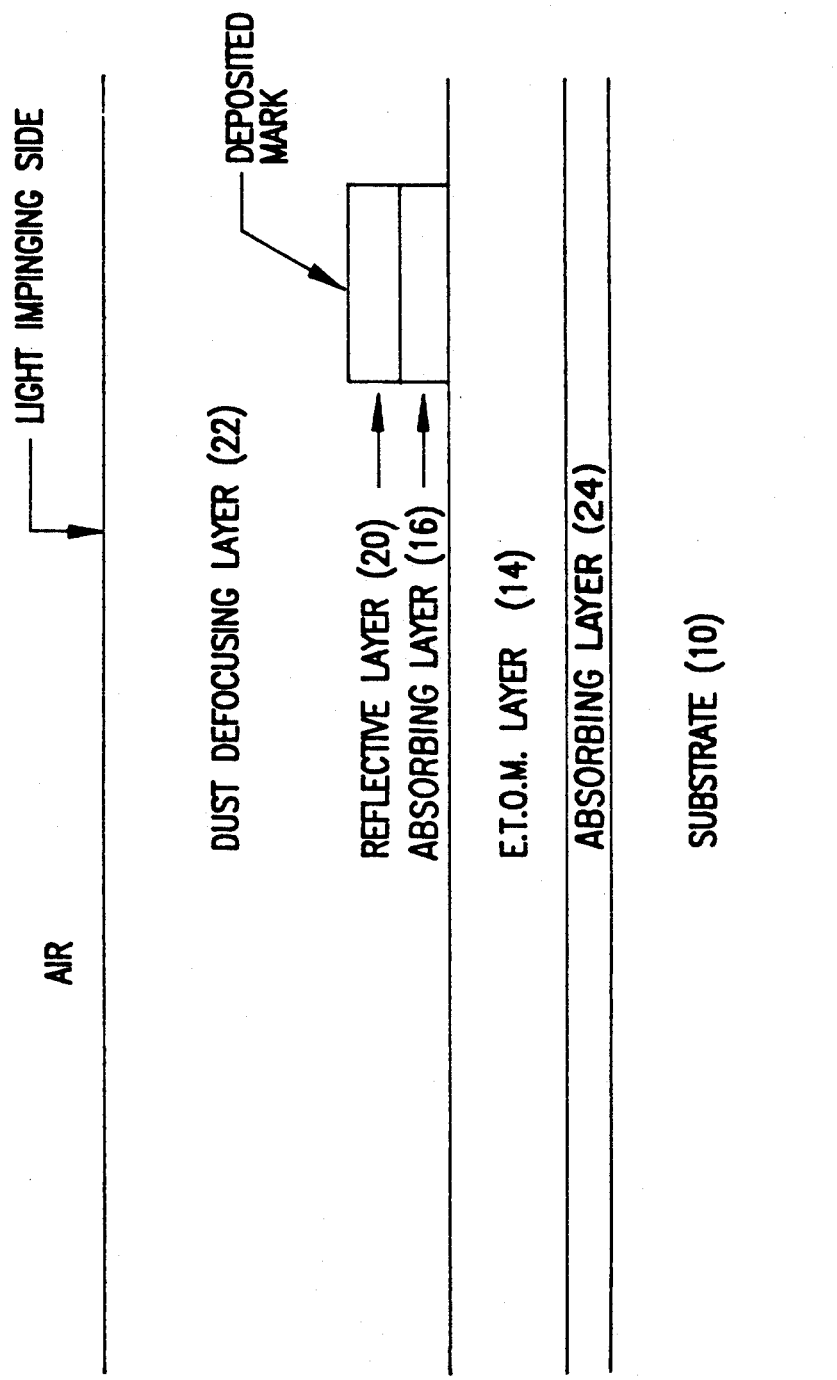
FIGS. 7-8 are diagrams illustrating alternative disk structure embodiments with individual reflective layer marks utilized to provide the permanent tracking and guidance information for the disk drive.

FIG. 7 is a diagram of an alternate embodiment of the present erasable optical disk in which reflective focus/tracking marks are deposited along each track location in order to provide for the focus and tracking functions of the erasable optical disk drive with which the disk structure of the present invention is utilized. The disk structure 100F includes a substrate 10 upon which an absorbing layer 24 is deposited in order to eliminate scattering of the infrared read and visible write beams in the electron trapping layer 14. The electron trapping layer 14 is deposited on top of the absorbing layer 24. A second absorbing layer 16 is deposited on top of the electron trapping layer 14 which serves to further reduce and eliminate scattering of the infrared and visible write beams in the electron trapping layer 14. A reflective layer 20 is deposited on top of the absorbing layer 16. A dust defocusing layer 22 is deposited on top of the reflecting layer 20.

The disk structure 100F shown in FIG. 7 may be formed by depositing the absorbing layer 16 on top of the electron trapping layer 14, utilizing a mask structure, and then depositing the reflective layer 20 on top of the absorbing layer 16 utilizing the same mask. In that manner, a mark or permanent bit may be deposited directly on the electron trapping layer at predetermined locations such that, when a laser beam utilized for the focus and tracking function strikes the reflective layer 20, the on-board optical and electronic circuits utilize that bit of information, together with the other bits so disposed around the circumference of the disk and in the various tracks as necessary, to perform the focusing and tracking functions of the erasable optical disk drive system of which the instant erasable optical disk forms a part.

The disk structure 100F may be deposited on both sides of the substrate 10 in order to form a double-sided disk. It is preferred, although not necessary, that the substrate 10 be of a ceramic and non-transparent material.

Figure 8:
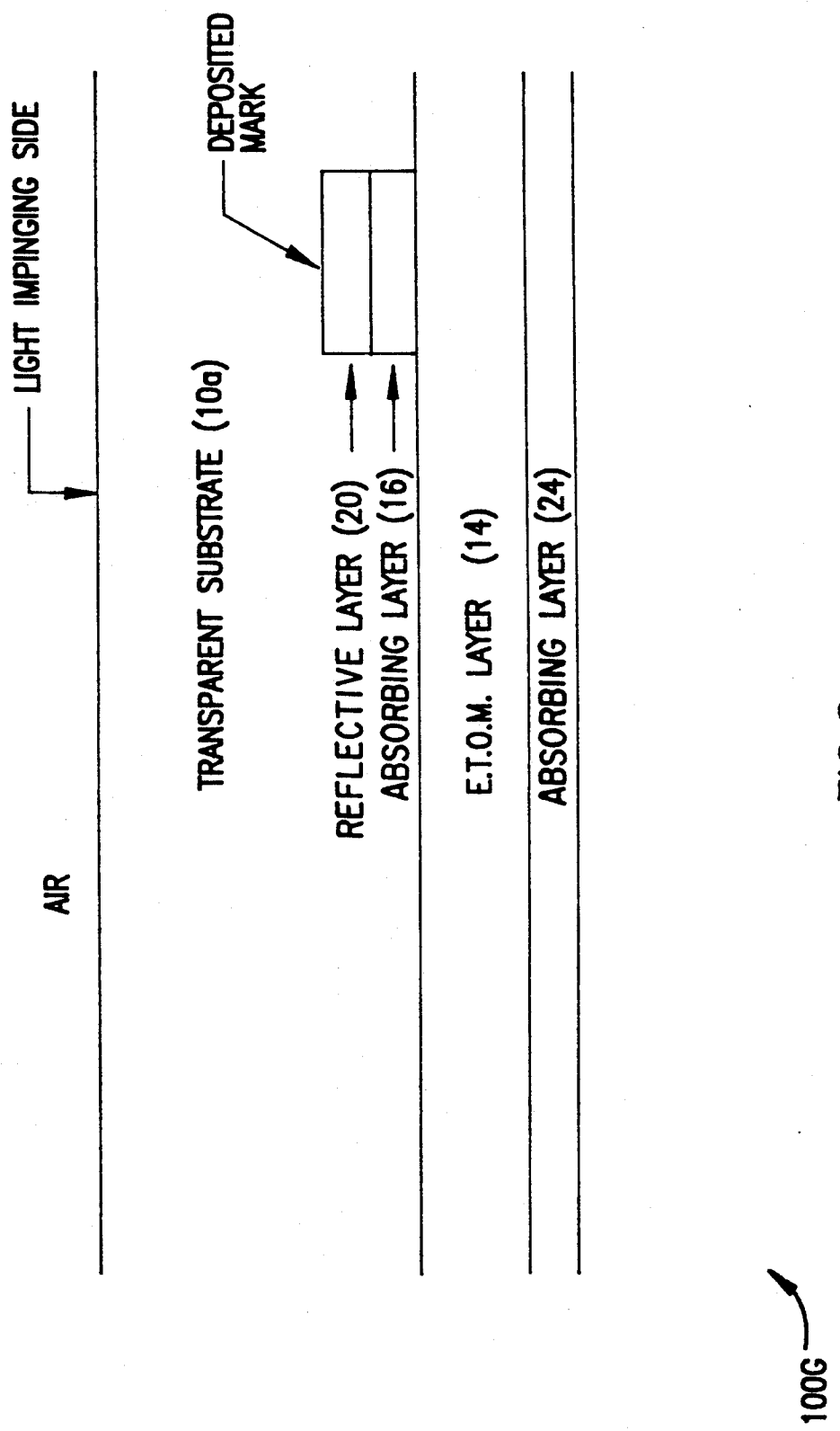

FIG. 8 shows a diagram of a disk structure similar to that shown in FIG. 7, with the exception that the layers 14, 16, 20 and 24 are deposited on the opposite side of a transparent substrate 10a. The functionality of the various layers is the same, however, as that described in connection with FIG. 7. The disk structure 100G shown in FIG. 8, however, may only be read from the front side of the disk, as is shown in FIG. 8. Two such disk structures may be sandwiched together to form a double-sided disk.

Figure 9:
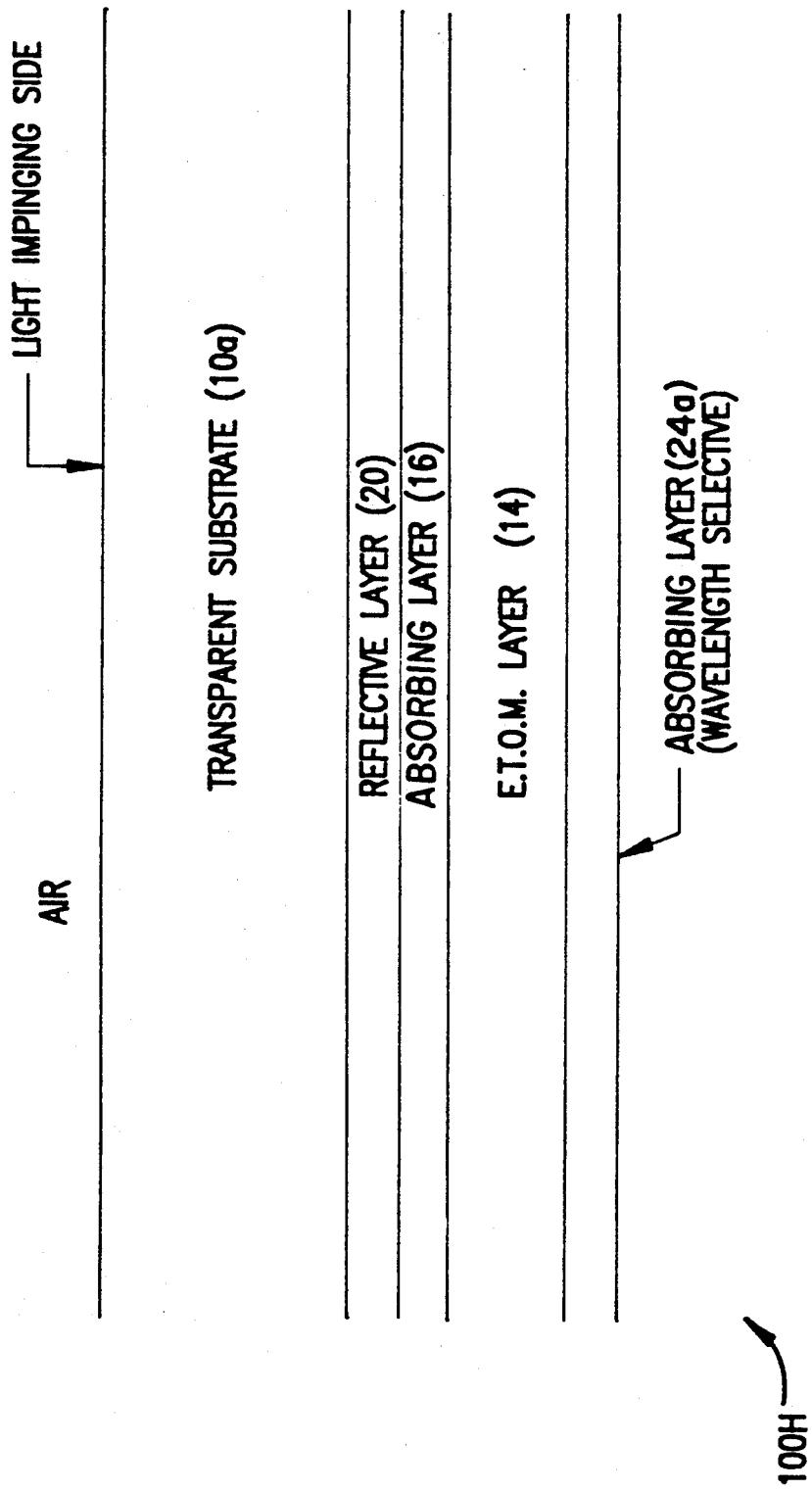
FIG. 9 is a diagram illustrating an alternate embodiment of the disk structure of the present invention.

FIG. 9 is a drawing of another alternate embodiment and functions in the same manner as the disk structure 100C shown in FIG. 4 with the exception that the absorbing layer 24a utilized as the outside layer on the transparent substrate 10a selectively absorbs scatter from the infrared read and visible write light beams while at the same time allowing transmission of the visible emission generated from the electron trapping layer by the read laser beam. An overcoat (not shown) layer, similar to layer 22a of FIGS. 6 and 11, may also be provided on top of the absorbing layer 24a in order to protect the disk structure 100H from dust and moisture. The disk structure 100H shown in FIG. 9 can be read from either side of the transparent substrate 10a.

Figure 10:
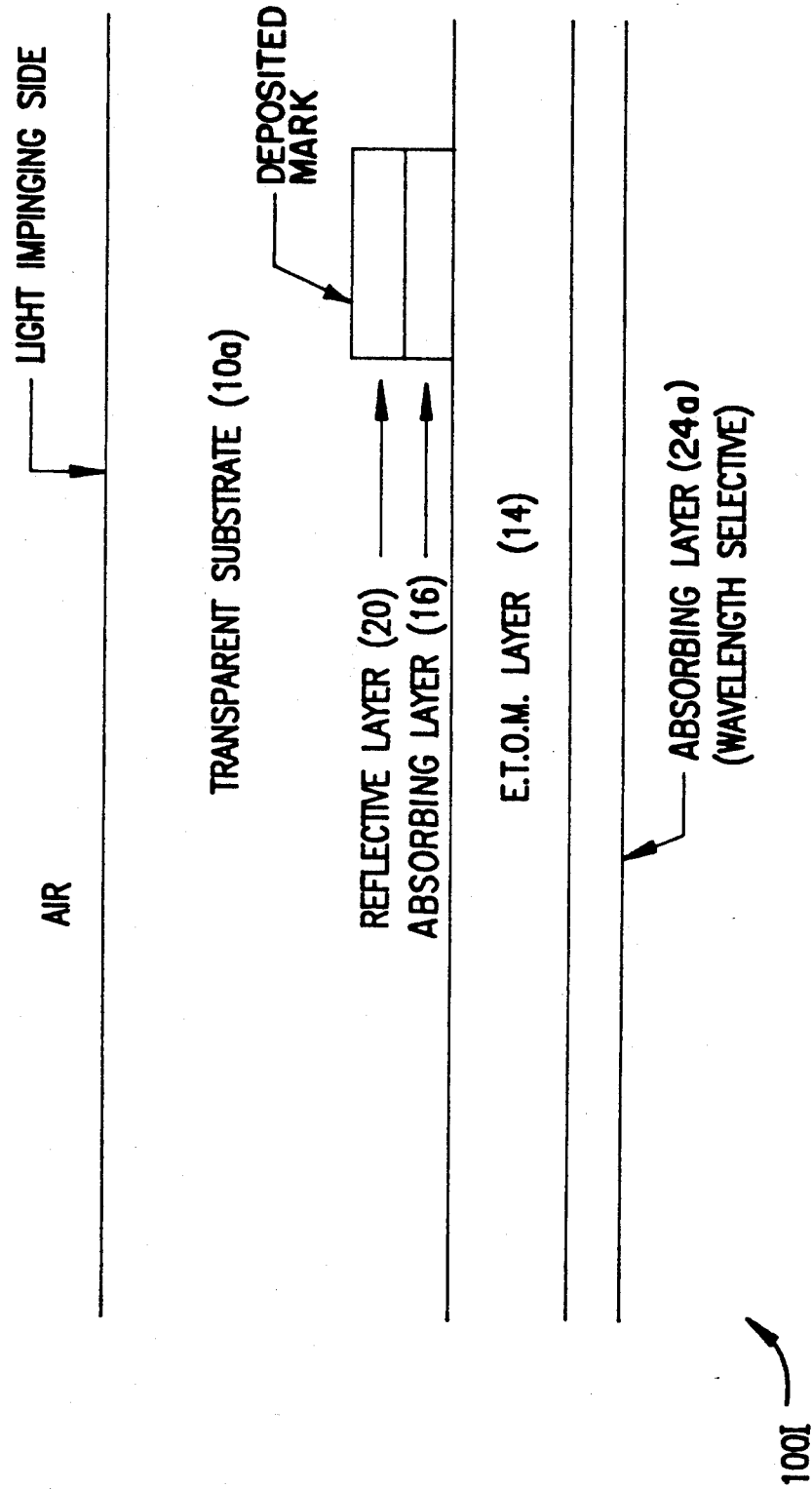
FIGS. 10-11 are diagrams illustrating yet further alternate embodiments of the present invention utilizing a layer of wavelength selective absorbing material.

FIG. 10 shows a drawing of an alternate embodiment of a disk structure 100H shown in FIG. 9 in which a deposited mark formed from a reflective layer 20 and an absorbing layer 16 is deposited on one side of the electron trapping layer 14. With respect to the electron trapping layer 14 and the absorbing layer 24a, the disk structure 100I shown in FIG. 10 functions in the same manner as the disk structure 100H shown in FIG. 9. With regard to the deposited mark, the disk structure 100I shown in FIG. 10 functions in the same manner as shown in FIG. 8.

Figure 11:
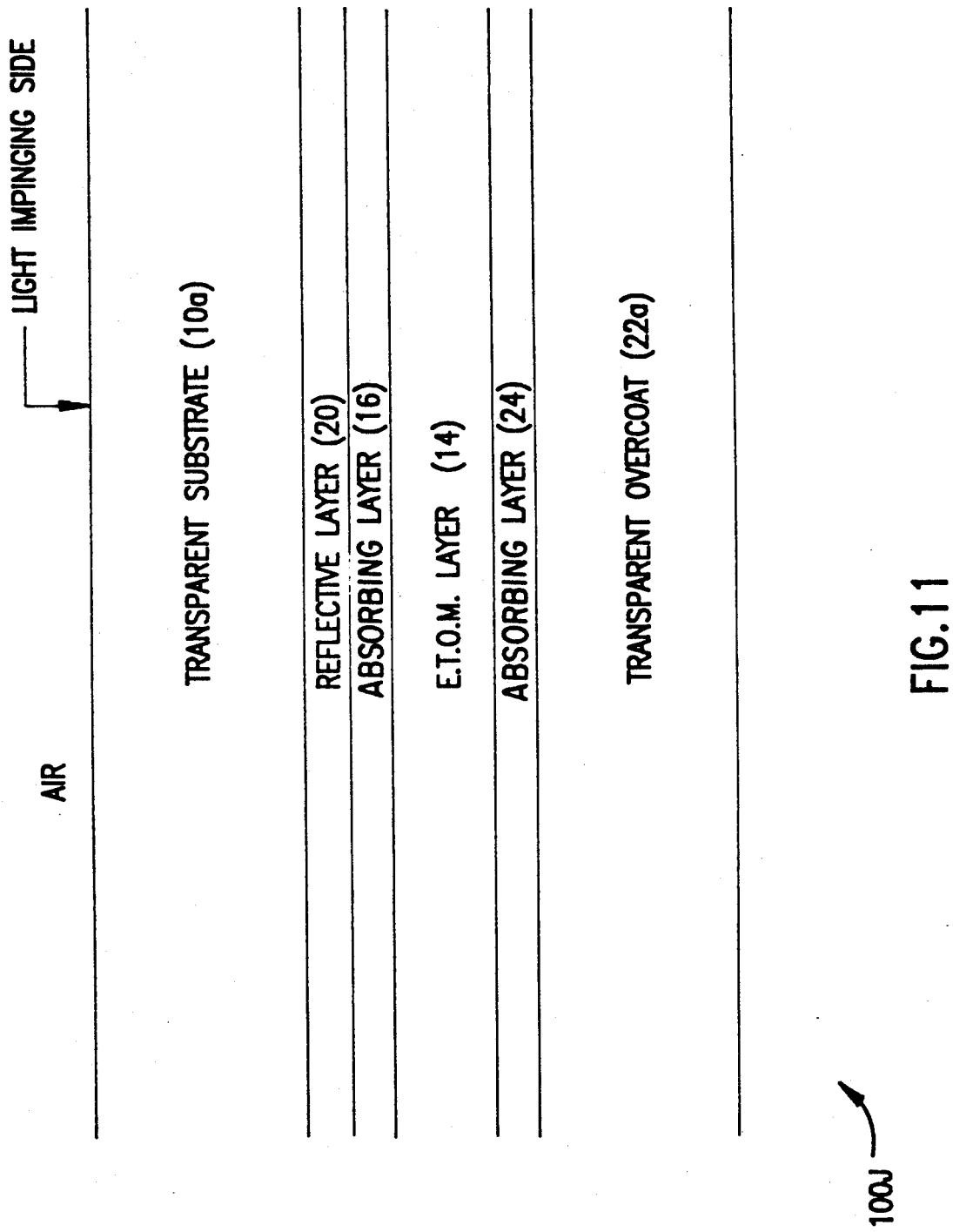

FIG. 11 shows a diagram of yet another alternate embodiment for the present erasable optical disk. In the disk structure 100J shown in FIG. 11, a transparent substrate 10a is utilized upon which a reflective layer 20 is deposited, which provides a specular surface for use in performing focus and tracking functions. An absorbing layer 16 is deposited on top of the reflective layer 20 in order to reduce scatter of light within the electron trapping layer 14 by absorbing light at the visible write and infrared read wavelengths. The electron trapping layer 14 is deposited on top of the absorbing layer 16.

A second absorbing layer 24 is deposited on top of the electron trapping layer 14 and serves to further reduce scatter from the infrared read and visible write beams within the electron trapping layer 14. The two absorbing layers 16 and 24 and the reflective layer 20 are deposited with predetermined hole patterns which define track locations on the disk. A transparent overcoat 22a may be deposited on top of the absorbing layer 24 in order to provide protection for the disk structure 100J from the dust and moisture. The disk structure 100J can be read from either the front or the backside of the substrate 10a. However, such structure can only be written to form the front of the transparent substrate 10a.

Each of the aforementioned structures has associated with it a pattern or patterns in the reflective and absorbing layers, 20 and 16 respectively, which create formats for tracking and focusing functions as well as designated open areas for writing and reading. These patterns may be created to provide information for use with either continuous composite or sampled servo focus/tracking schemes. In FIGS. 1 through 9 and 11, focusing and tracking may be accomplished utilizing a three laser system as described in U.S. patent application Ser. No. 07/449,002, filed on Dec. 12, 1989 now U.S. Pat. No. 5,113,387, or with a sampled servo With two laser systems. FIGS. 7, 8 and 10 are compatible with two laser sampled servo systems only.

As discussed above, the erasable optical disks that incorporate an active emissive storage layer, such as the electron trapping optical memory phosphor-based medium described herein, use three wavelengths of light for operating: a writing wavelength, an erasing wavelength and a read-out wavelength. The incident writing and erasing beams are coherent laser beams and may be thought of as plane waves of finite transverse extent in the electron trapping layer 14. In contrast, the read-out signal is an incoherent, outgoing, spherical light field. That difference is exploited in the preferred erasable optical disk structure 100K discussed below.

It is advantageous to utilize a reflective layer to increase, and approximately double, the level of the incoherent read-out signal obtained from the erasable optical disk of the present invention.

Without a reflective layer, the intensity of the writing laser electric field within the electron trapping layer is very close to constant. The total number of traps filled in response to a writing pulse is then linearly related to the field intensity up to the point of saturation, the point at which there are no more traps available. However, large deviations from its main value occur in the light field intensity generated by the writing laser electric field within the electron trapping layer with which a reflective layer is also used. The degree to which available electron traps are filled by the writing beam depends on the local amplitude of the writing laser electric field. At some depths into the electron trapping layer, the light intensity almost vanishes, leaving many traps unfilled. At others, it is many times larger than the main value and some light is therefore unproductive because of saturation.

The use of a second and different, wavelength for erasing purposes is also negatively affected by the use of a reflective layer. The probability of escape of light from one of the traps in the electron trapping layer is linearly dependent on the local stimulating light intensity. The discussion above for the writing laser beam is also applicable with regard to the erasing laser beam. At points at which the erasing intensity vanishes, trapped electrons will not be released. At points at which the intensity is very large, only the filled traps can contribute; once they are released, additional light energy is unproductive.

Therefore, the net effect of the standing waves introduced by the reflective layer is a loss of efficiency in storage and read-out. Since the reflective layer does, however, result in an advantage in efficiency with which the read-out light generated is detected, it is desirable to retain such a reflective layer. Since the incoherent read-out emission is directed equally in all directions, by introducing a reflective layer, the light in the back hemisphere is re-directed so that it travels towards the optical drive and the read optics and electronics.

Figure 12:
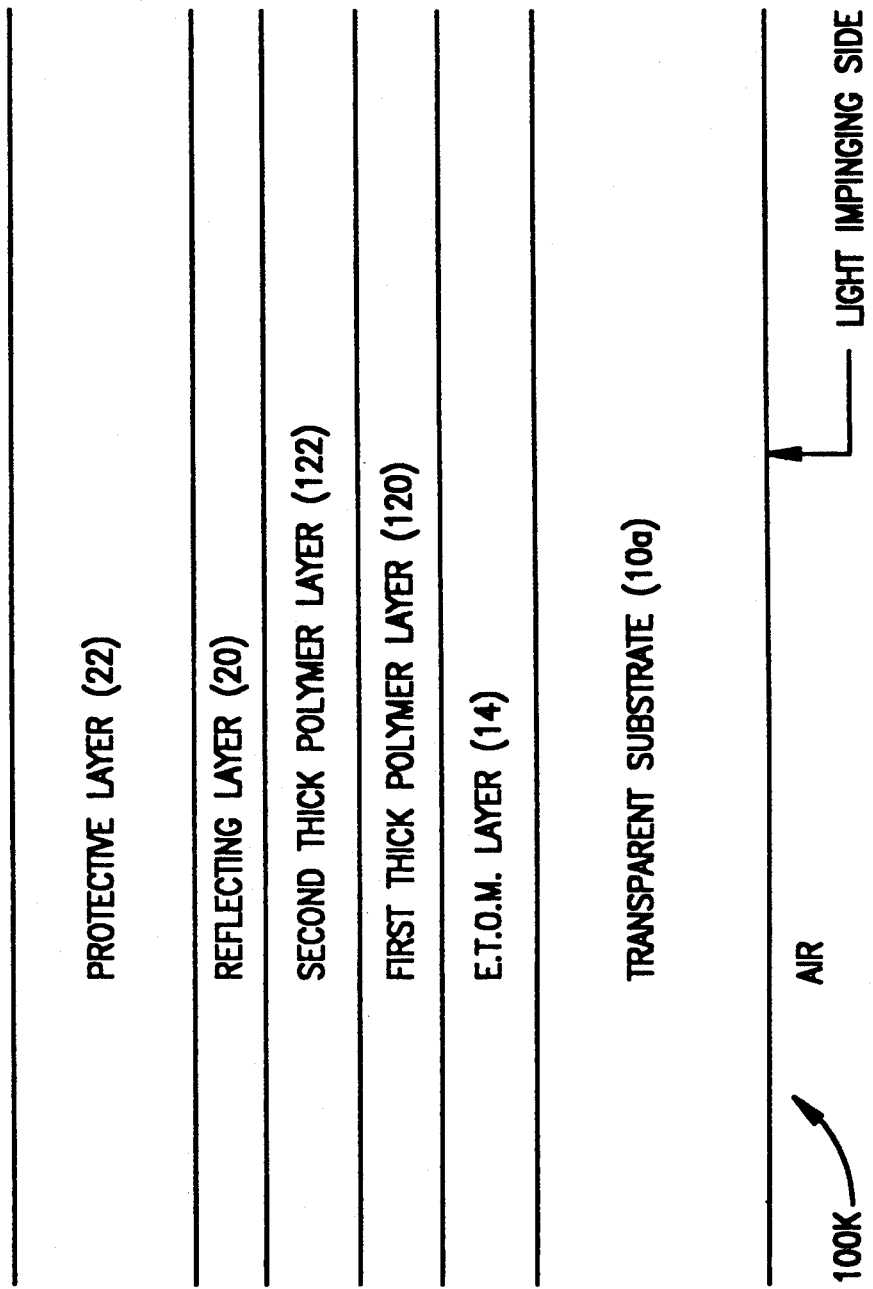
FIG. 12 is a diagram illustrating yet another alternative embodiment of the present invention in which two layers of wavelength selective absorbing material are utilized in addition to a single layer of reflective material.

The preferred embodiment of the present invention, as shown in FIG. 12, selectively suppresses the coherent reflection of the two coherent laser beams used for writing and erasing functions. In that manner, it is possible to obtain the benefits of the redirection of the read-out beam without introducing large standing waves in the writing and erasing beams. In the absence of standing waves in the internal fields of the writing and erasing beams, the maximum number of traps in the electron trapping layer can be filled and emptied, thus producing the maximum read-out signal. Redirection of the read-out light to the drive side of the optical disk doubles the signal available to the read detector if there were no losses in transit of the read-out light due to scattering and absorption.

FIG. 12 shows the structure of the preferred embodiment of the erasable optical disk of the present invention. The erasable optical disk 100K shown in FIG. 12 is formed by a transparent substrate 10a upon which an electron trapping layer 14 is deposited. On top of the electron trapping layer 14, a first thick polymer layer 120 is deposited. That dyed polymer layer absorbs the erasing light but is transparent at the writing and read-out wavelengths. It may preferably be formed from a polymer loaded with an infrared absorbing dye. A second thick polymer layer 122 is deposited on top of the first thick polymer layer 120. The second thick polymer layer 122 is a dyed polymer that absorbs the writing light but is transparent at the read-out wavelengths. The second thick polymer layer 122 may preferably be formed from a blue-green absorbing dye polymer.

The reflecting layer 20 may be formed from a metal, such as aluminum, as previously discussed herein, or from the other materials also discussed herein. That reflecting layer 20 is deposited on top of the second thick polymer layer 122. Finally, an environmental layer 22 is deposited on top of the reflecting layer 20. As discussed above, the first and second thick polymer layers 120, 122 and the reflecting layer 20 form a structure which strongly reflects the read-out light without reflecting the writing and erasing light. Each of the thick polymer layers is preferably between 0.01 mm(10 microns) and 1 mm in thickness.

In operation, the writing wavelength passes through the electron trapping layer 14 and is absorbed in the second thick polymer layer 122. The writing light field within the electron trapping layer 14 is uniform.

The erasing wavelength passes through the electron trapping layer 14 and is absorbed in the first thick polymer layer 120. The erasing light field within the electron trapping layer 14 is uniform.

The read-out signal passes through the transparent substrate 10a and the electron trapping layer 14 in the usual manner. However, the read-out signal emanating in the rear hemisphere passes undisturbed through the first and second thick polymer layers 120, 122 and is reflected by the reflecting layer 20. The read-out signal is then redirected into the front hemisphere of the disk. That increases the signal seen by the read optics of the drive. The transit delay experienced by the reflected read-out light due to its longer path to the drive read detector is negligible since light requires only 0.03 nS in order to travel one centimeter.

The use of optically thick wavelength selective layers with the electron trapping layer in an erasable optical disk is advantageous since such layers are much less expensive to fabricate and can be made of materials which would not work in thin layers. The disk structure of FIG. 12 can be implemented equally as well by utilizing a highly scattering layer rather than the reflecting layer 20. The use of such a highly scattering layer would be useful in those instances where the larger fraction of redirected light is misdirected because the index of refraction of the electron trapping layer is high.

Alternatively, instead of using a structure designed to absorb the two undesired wavelengths, a coherent optical filter stack could be used to transmit those undesired wavelengths out of the disk structure while reflecting the one desired wavelength. The object is to produce a tuned dielectric reflector whose reflection at the desired wavelength strongly peaked at the read-out wavelength.

Figure 13A:
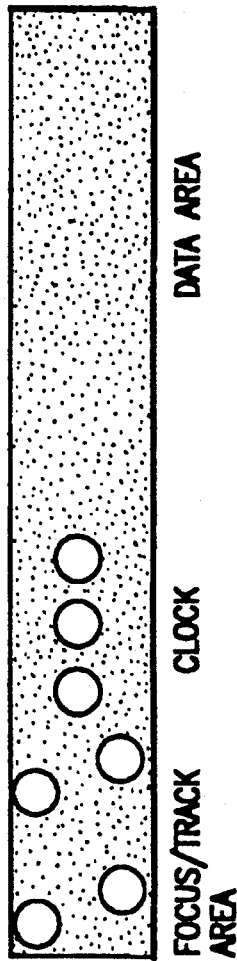
FIG. 13 illustrates sample focus, tracking and data patterns for use with the disk structures of the present invention.

The patterns shown in FIGS. 13A, B and C may be created by either depositing individual servo marks as illustrated in FIGS. 7, 8 and 10, or by depositing continuous films (elements 16 and 20) with specific areas left open for reading, writing, focusing and tracking as depicted in FIGS. 1–6, 9 and 11. For sampled servo systems, focusing may be accomplished in specified areas along the track whether those area are reflective layers or media layers. A continuous composite system can only be accomplished off-track on reflective surfaces to prevent discharging of the data.

Figure 13B:
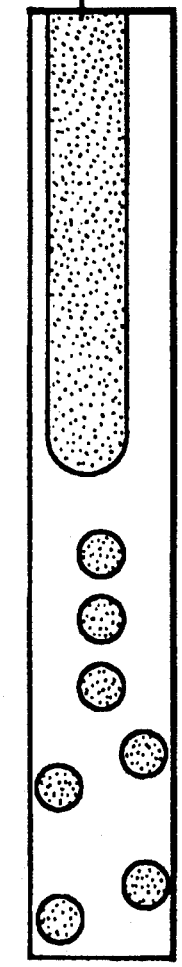
Figure 13C:
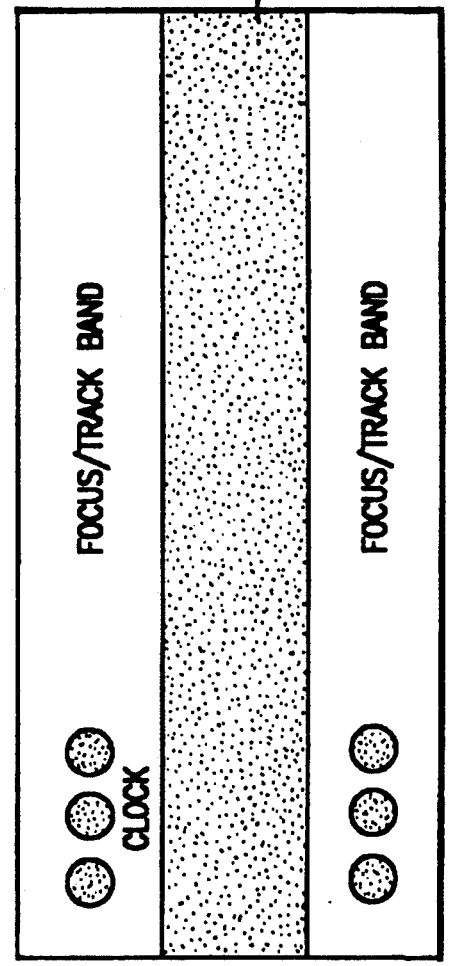

FIGS. 13A, B and C shows three different types of tracking formats compatible with these disk structures of the present invention. FIG. 13A shows a sampled servo format such as those depicted in FIGS. 7, 8 and 10. The format in FIG. 13B is compatible with a sampled servo only. FIG. 13C is used for a three laser, continuous composite system only. FIGS. 13B and 13C are for use with structures described and shown in FIGS. 1 through 6, 9 and 11.

Although only a preferred embodiment is specifically illustrated and described herein, it should be appreciated that many modifications and variations of the present invention are possible in light of the above teachings and within the purview of the appended claims without departing from the spirit and intended scope of the invention.

What is claimed is:

1. An erasable optical disk for use with an erasable optical disk drive system, having a readout stimulation laser and a recording laser, which utilizes electron trapping optical memory material as the storage medium comprising:
   a. a disk substrate;
   b. a layer of electron trapping optical memory material coated on said disk substrate;
   c. a first light absorbing layer coated on said layer of electron trapping optical memory material, said first light absorbing layer attenuating a first wavelength of light;
   d. a second light absorbing layer coated on said first absorbing layer, said second light absorbing layer attenuating a second wavelength of light; and
   e. a reflective layer coated on said second absorbing layer.

2. The erasable optical disk of claim 1, wherein said first light absorbing layer attenuates light either at the wavelength of the recording laser or the readout stimulation laser.

3. The erasable optical disk of claim 1, wherein said second light absorbing layer attenuates light at a wavelength of the laser not attenuated by the first light absorbing layer.

4. A method of making an erasable optical disk for use with an erasable optical disk drive system, having a readout stimulation laser and a recording laser, which utilizes electron trapping optical memory material as the storage medium comprising the steps of:
   a. forming a layer of electron trapping material on a disk substrate;
   b. forming a first light absorbing layer on said layer on said layer of electron trapping optical memory material, said first light absorbing layer attenuating a first wavelength of light;
   c. forming a second light absorbing layer on said first light absorbing layer, said second light absorbing layer attenuating a second wavelength of light; and
   d. forming a reflective layer on said second light absorbing layer.

5. The method of claim 4, further including the step of forming a barrier layer on said reflective layer.

6. The method of claim 4, wherein said first light absorbing layer attenuates light either at the wavelength of the recording laser or the readout stimulation laser.

7. The method of claim 4, wherein said second light absorbing layer attenuates light at a wavelength of the laser not attenuated by the first light absorbing layer.

8. An erasable optical memory system, having a readout stimulation laser and a recording laser, which utilizes electron trapping optical memory material as a storage medium, comprising:
   a. a disk substrate;
   b. a layer of electron trapping optical memory material coated on said disk substrate;
   c. a first light absorbing layer coated on said layer of electron trapping optical memory material, said first light absorbing layer attenuating a first wavelength of light;
   d. a second light absorbing layer coated on said first absorbing layer, said second light absorbing layer attenuating a second wavelength of light; and
   e. a reflective layer coated on said second absorbing layer.

9. The erasable optical memory system of claim 8, further including a barrier layer coated on said reflective layer.

10. The erasable optical memory system of claim 8, wherein said first light absorbing layer attenuates light either at the wavelength of the recording laser or the readout stimulation laser.

11. The erasable optical memory system of claim 8, wherein said second light absorbing layer attenuates light at a wavelength of the laser not attenuated by the first light absorbing layer.

12. The erasable optical disk of claim 1, further including a barrier layer coated on said reflective layer.

* * * * *